(12) United States Patent
Wang et al.

(10) Patent No.: US 6,468,886 B2
(45) Date of Patent: Oct. 22, 2002

(54) PURIFICATION AND DEPOSITION OF SILICON BY AN IODIDE DISPROPORTIONATION REACTION

(75) Inventors: Tihu Wang, Littleton, CO (US); Theodore F. Ciszek, Evergreen, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/941,490

(22) Filed: Aug. 28, 2001

(65) Prior Publication Data
US 2002/0022088 A1 Feb. 21, 2002

Related U.S. Application Data

(63) Continuation-in-part of application No. 09/334,166, filed on Jun. 15, 1999, now Pat. No. 6,281,098.

(51) Int. Cl.[7] .......................... H01L 21/20; H01L 21/36
(52) U.S. Cl. ....................................................... 438/488
(58) Field of Search ............................. 117/88, 97, 99; 118/725, 726; 136/243; 423/345, 350; 438/488

(56) References Cited

U.S. PATENT DOCUMENTS 4,910,163 A * 3/1990 Jain ............................ 437/81

* cited by examiner

Primary Examiner—Michael Sherry
Assistant Examiner—Asok Kumar Sarkar
(74) Attorney, Agent, or Firm—Paul J. White

(57) ABSTRACT

Method and apparatus for producing purified bulk silicon from highly impure metallurgical-grade silicon source material at atmospheric pressure. Method involves: (1) initially reacting iodine and metallurgical-grade silicon to create silicon tetraiodide and impurity iodide byproducts in a cold-wall reactor chamber; (2) isolating silicon tetraiodide from the impurity iodide byproducts and purifying it by distillation in a distillation chamber; and (3) transferring the purified silicon tetraiodide back to the cold-wall reactor chamber, reacting it with additional iodine and metallurgical-grade silicon to produce silicon diiodide and depositing the silicon diiodide onto a substrate within the cold-wall reactor chamber. The two chambers are at atmospheric pressure and the system is open to allow the introduction of additional source material and to remove and replace finished substrates.

13 Claims, 4 Drawing Sheets

PURIFICATION AND DEPOSITION OF SILICON BY AN IODIDE DISPROPORTIONATION REACTION

CROSS-REFERENCE TO RELATED PATENT APPLICATION

This patent application is a continuation-in-part of U.S. patent application Ser. No. 09/334,166, filed on Jun. 15, 1999, now U.S. Pat. No. 6,281,098.

CONTRACTUAL ORIGIN OF THE INVENTION

The United States Government has rights in this invention pursuant to Contract No. DE-AC36-99GO10337 between the United States Department of Energy and the National Renewable Energy Laboratory, a division of Midwest Research Institute.

FIELD OF THE INVENTION

The present invention pertains generally to producing silicon feedstock for the semiconductor industry, and more specifically, to purifying metallurgical-grade silicon by means of iodine chemical vapor transport to produce pure silicon feedstock for use in fabricating photovoltaic and other semiconductor devices.

BACKGROUND OF INVENTION

About 85% of the photovoltaic modules sold annually are made from silicon. Manufacturers have repeatedly expressed concern about the future supply of low-cost feedstock as this market continues to grow at a rate exceeding 30% each year. Recent reports project that demand for silicon from the electronics industry will exceed the current supply levels by a factor of 2 to 4 within the next decade. This projection does not represent a fundamental material shortage problem because the technology, quartzite, and coke needed to make feedstock are in abundant supply. Rather, the issue is how best to supply the required feedstock with the requisite purity (~99.999%) to manufacturers at an acceptable cost. Several methods exist for the manufacture of silicon feedstock that meet at least a portion of the manufacturing sector's requirements, including the widely used silicon chlorosilane method. However, in general, the existing methods are complicated, generate a significant amount of hazardous by-products, require a vacuum system, and are, therefore, quite expensive.

A number of new methods are under consideration for the purification of metallurgical-grade silicon (MG-Si), including: (1) repetitive porous MG-Si etching, gettering and surface-removal of impurities; (2) MG-Si gaseous melt-treatment; and (3) MG-Si purification by recrystallization of Si from MG-Si/metal solutions. Many of these potential methods improve upon the deficiencies of the existing techniques, yet most of the above-referenced techniques still contain some of the above-listed drawbacks, including specifically, the level of complexity of the processes used to generate consistent and predictable results, and which also increase the already high costs associated with producing pure feedstock products. Specifically, the porous silicon etch/gettering removal of impurities, although effective in the near surface region, appears impractical for bulk purification because of the large number of process cycles that would be required and that would thus drive up the time and cost needed to produce purified feedstock in sufficient quantities. The gaseous melt treatment using moist argon appears promising for reducing boron levels from the MG-Si source material, but requires much longer treatment times and more efficient exposure to the liquid silicon in order to be cost-efficient at the level required for this specific problem. Finally, the recrystallization of silicon from MG-Si/metal solutions remains essentially theoretical at this time and is not the short-term solution needed to address current commercial concerns.

SUMMARY OF INVENTION

Accordingly, an object of the present invention is to is to provide a high deposition rate process for producing pure silicon feedstock from metallurgical-grade silicon.

Another object of the present invention is to provide a viable, economical and high through-put method of depositing pure silicon feedstock for solar cells and other applications.

Yet another object of the present invention is to provide an apparatus by which to produce pure silicon feedstock according to the method of the present invention.

Additional objects, advantages and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the method of this invention may comprise producing pure silicon feedstock by first placing solid metallurgical-grade silicon and solid iodine in the bottom portion of a cold-wall reactor, heating the bottom portion of the cold-wall reactor so as to create a thermal gradient while vaporizing the MG-Si and the iodine, which react chemically to produce $SiI_2$ precursor, drive a portion of the $SiI_2$ to a lower temperature and to thereby deposit the silicon upon a substrate within the cold-wall reactor chamber, and, by taking advantage of a variance in the partial pressures of the metal iodides vapors formed, separate the desirable iodides from the undesirable byproduct iodides by condensation of the desirable iodides on surfaces in the reaction chamber, capturing the iodide condensate in the reaction chamber, and transferring the condensate to a distillation chamber. In the distillation chamber, the condensate of desirable iodides is vaporized, and, once again taking advantage of a variance in the partial pressures of the metal iodide vapors formed to further separate residual undesirable iodide condensates from the desirable $SiI_4$ condensate, collect the $SiI_4$ condensate, and return it to the cold-wall reaction chamber for further cyclical processing until a desired quantity of pure silicon is deposited on the substrate within the cold-wall reactor chamber that it can be removed and replaced with a new substrate.

To produce feedstock using the method described herein, the apparatus of this invention may comprise a plurality of interconnected chambers that are at about atmospheric pressure. A first chamber may have a bottom portion, a mid-portion and a top portion, along with a plurality of inlets and a plurality of outlets. A second chamber may also have a bottom portion, a mid-portion and a top portion, as well as an inlet and a plurality of outlets. A third chamber may have an inlet and an outlet. The metallurgical-grade silicon may be deposited in the first chamber along with an amount of iodine source material. The bottom portion of the first chamber may be heated, thus producing a temperature gradient within the first chamber and also vaporizing a portion of the MG-Si and the I. Some of the vaporized material will form $SiI_2$ which may be deposited upon a substrate in the mid-portion of the first chamber. Additionally, many byproduct metal iodide vapors will be formed, some of which will be separated and removed from the first chamber permanently and some of which will be separated and removed from the first chamber and transferred to the second chamber as liquid condensate.

The second chamber may also be heated, thus producing another temperature gradient and also vaporizing a portion of the liquid condensate. Some of the vaporized condensate will form a $SiI_4$ vapor which will be separated from other metal iodide vapors formed, collected, and transferred to a third chamber to be subsequently returned to the first chamber for re-use. The remaining undesirable metal iodide vapors formed will be separated and removed from the second chamber permanently. Other embodiments and variations based upon the above-described process and apparatus, as well as that which will be disclosed in more detail below, will be recognized by those persons skilled in the art.

BRIEF DESCRIPTION OF THE DRAWINGS

The accompanying drawings, which are incorporated herein and form a part of the specification illustrate preferred embodiments of the present invention, and together with the description, serve to explain the principles of the invention.

DETAILED DESCRIPTION OF THE PREFERRED EMBODIMENTS

Figure 1:
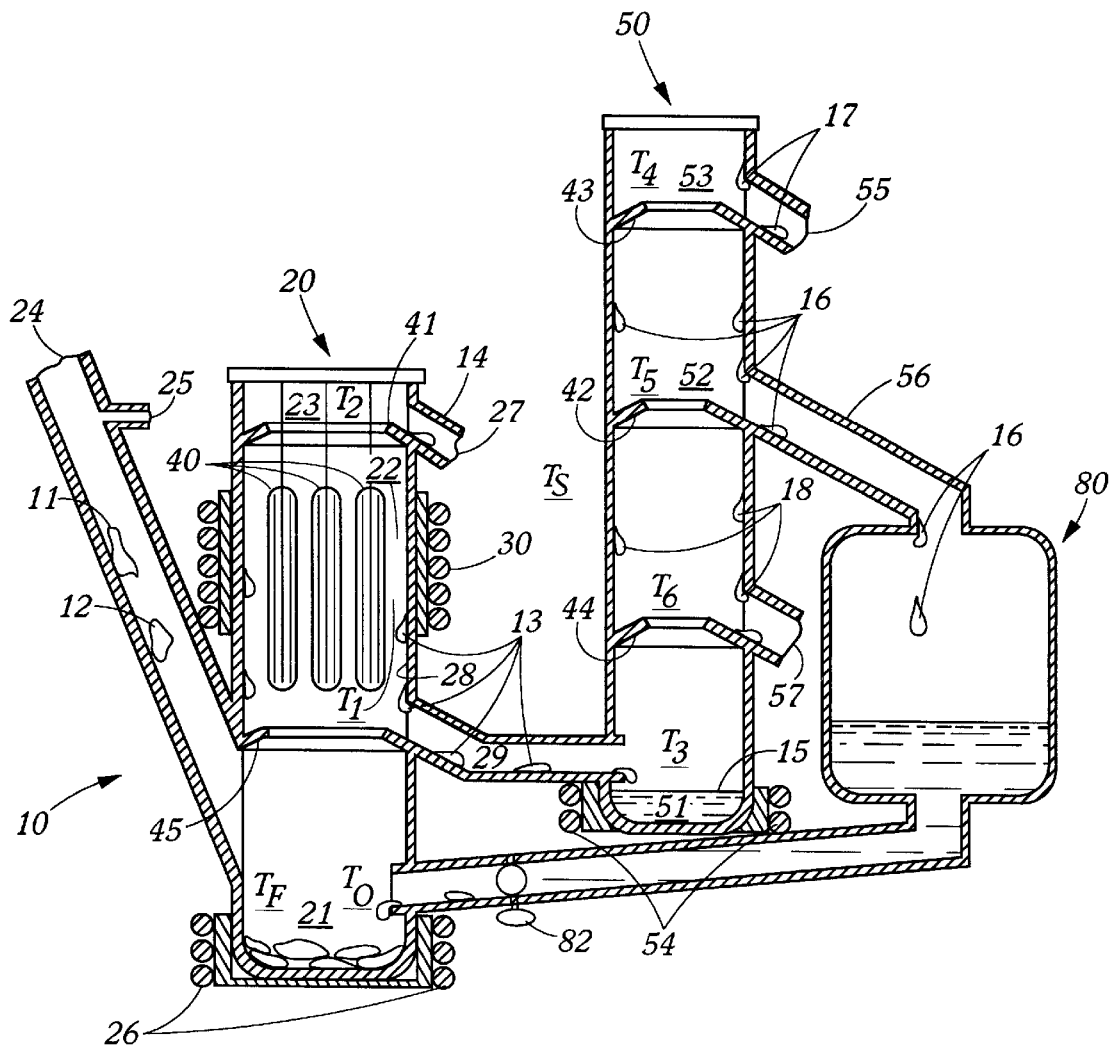
FIG. 1 is a cut-away schematic of the apparatus used to practice the process of the present invention.

A pure silicon feedstock can be produced at high deposition rates and at low costs with the process and apparatus disclosed herein. Referring generally to FIG. 1, a silicon purification system 10 according to this invention has three interconnected chambers 20, 50, 80. In the first chamber 20, also called a cold-wall reactor chamber, solid pieces of metallurgical-grade silicon (MG-Si) 11 and iodine 12 are heated and evaporated in a bottom portion 21 of chamber 20 to create a vapor mixture of silicon and iodine, which react chemically to form $SiI_2$ gas. The $SiI_2$ gas rises to a slightly cooler region 22 in the chamber 20, where it goes through a disproportionation reaction to produce Si and $SiI_4$. The Si deposits on a substrate 40, while the $SiI_4$ condenses on the interior wall 28 of the chamber 20, as indicated by droplets 13. The $SiI_4$ condensate 13 is collected by an annular catch ring 40 at the bottom portion of region 22 of chamber 20, which ring 40 routes the condensate 13 to a conduit 29 that is connected to a second chamber 50, which is also called a distillation chamber.

The MG-Si feedstock 11 also contains other elements, such as boron (B) and phosphorus (P), which also react with iodine to produce undesirable iodides, such as $BI_3$ and $PI_3$. However, because they have different vapor pressures than the silicon iodides, these undesirable iodides do not enter into the $SiI_2$ disproportionation process described above, so the B and P do not deposit on the substrate 40. Instead, they are substantially condensed and drawn off in a still cooler, top portion 23 of the reaction chamber 20, by an annular catch ring 41, as indicated by droplet 14 in conduit outlet 27. However, this separation process is not perfect, and some amount of $BI_3$ and $PI_3$ condenses below the outlet 27 in the mid-portion 22 of the reaction chamber 20, thus mixing with the $SiI_4$ condensate 13 that runs via conduit 29 into the distillation chamber 50. Other impurities, such as carbon tetraiodide ($CI_4$) may also be produced in the reaction chamber 20 and also mix with the $SiI_4$ condensate 13 and run via conduit 29 into the distillation chamber 50.

The purpose of the distillation chamber 50, therefore, is to further purify the $SiI_4$ by separating it from the undesirable iodides, e.g., $BI_3$, $PI_3$, $CI_4$, and others. To do so, $SiI_4$, $BI_3$, $PI_3$, $CI_4$, and others mixed together in the pool 15 in the bottom portion 51 of the distillation chamber 50 are vaporized. The $SiI_4$, $BI_3$, $PI_3$, and $CI_4$ vapors rise in the distillation chamber 50, where temperature decreases as distance from the bottom increases. The $SiI_4$ condenses at a higher temperature than $BI_3$ and $PI_3$, so the $SiI_4$ condenses, as illustrated by droplets 16, in the mid-portion 52 and is drawn out of the distillation chamber 50 by an annular catch ring 42 and conduit 56. Meanwhile, the undesirable $BI_3$ and $PI_3$ condense at a cooler temperature in the top portion 53 of distillation chamber 50, as indicated by droplets 17, and is captured and drawn out of the distillation chamber 50 by an annular catch ring 43 and conduit 55. The $CI_3$ is condensed at a higher temperature in a lower portion of the distillation chamber 50, as indicated by droplets 18, and is captured and drawn out of chamber 50 by annular catch ring 44 and conduit 57.

Only the middle conduit 56, carrying the $SiI_4$ condensate 16 is connected to the third chamber or reservoir 80. Therefore, the reservoir 80 collects and holds the purified $SiI_4$ condensate 16. A feed tube 81 connects the reservoir 80 back to the bottom portion 21 of the reaction chamber 20, and a metering valve 82 meters the purified $SiI_4$ into the reaction chamber 20, where it is joined in the reaction cycle by combining with additional Si from the vaporied MG-Si feedstock 11 to produce more $SiI_2$, which cools and disproportionates in mid-portion 22 to deposit more Si on the substrate 40 and produce more $SiI_4$ to be repurified in the distillation chamber 50, as described above. When a desired amount of pure Si is deposited on the substrate 40, the substrate 40 can be removed and replaced with new substrates 40.

With this overview of the silicon purification system 10 of this invention in mind, a more detailed explanation of the components and process steps is provided below. The reaction chamber 20, as mentioned above, has a bottom portion 21, a mid-portion 22 and a top portion 23. Cold-wall reactor chamber 20 further has a first inlet 24 through which metallurgical-grade silicon (MG-Si) source material 11 and iodine source material 12 are introduced into the chamber 20 and placed into the bottom portion 21. A purge line 25 may be connected to the system 10 through the first inlet 24 and is used initially to introduce gas (i.e. hydrogen) with which to drive all foreign vapors from the system 10 prior to operation. During operation, the purge line 25 is used to introduce a blanketing gas (i.e. hydrogen or any other blanketing gas that is less dense than, and non-reactive with, iodine vapor) with which to keep air out of the otherwise open system 10.

Heater 26 at least partially surrounds the bottom portion 21 of the chamber 20. Once MG-Si source material 11 and iodine source material 12 are introduced into the bottom portion 21 of the chamber 20, heat from heater 26 will be applied to the bottom portion 21 of chamber 20 to vaporize a portion of both the MG-Si source material and the iodine source material. The heat applied by heater 26 will also create a temperature gradient to form within chamber 20, such that the temperature $T_0$ at the bottom portion 21 of the chamber 20 is warmer than the temperature $T_1$ at the mid-portion 22 of the chamber 20, which in turn is warmer than the temperature $T_2$ at the top portion 23 of the chamber. During the first stage of operation, the heater 26 initially applies enough heat to bring the temperature ($T_0$) at the bottom portion 21 of the chamber 20 to between 500° and 1000° C. At this range of temperatures, some silicon (Si) present in the MG-Si source material 11 will vaporize and react with a vapor of the iodine (I) source material 12 to form silicon tetraiodide ($SiI_4$) vapor and iodine (I) vapor. Several other impurities present in the MG-Si source material 11 (i.e., those impurities, e.g., boron (B), phosphorus (P), iron (Fe), and aluminum (Al), with free energies of formation with iodine greater in absolute value than that of silicon and iodine) will likewise react with the iodine source material 12 to form several impurity iodides (those impurities present in the MG-Si source material with free energies of formation with iodine less in absolute value than that of silicon and iodine will be retarded). The silicon tetraiodide ($SiI_4$) vapor and the several impurity iodide vapors (e.g., $BI_3$ and $PI_3$) are then driven upwardly through the mid-portion 22 of the chamber 20 and into the top portion 23 of the chamber 20, where the lower temperature ($T_2$ is about 120° C.) causes some of the impurity iodide vapors (e.g., $BI_3$ and $PI_3$) to condense, as indicated by droplets 14. The condensed impurity iodides 14 are then mostly collected at a first outlet 27 by annular catch ring 41 and drawn out of the reaction chamber 20 by way of a cold trap or such other mechanism that will be instantly recognized by and familiar to those persons skilled in the art, the details of which need not be further discussed herein.

The purer vapors, which include silicon tetraiodide ($SiI_4$) vapor, will condense on the interior wall 28 of the chamber 20, as indicated by droplets 13, at some point positioned lower than the first outlet 27. It is important to keep the temperature ($T_1$) of the interior wall 28 "cold", i.e., the temperature $T_1$ of the interior wall 28 should be maintained between 120° and 700° C., in order to prevent any silicon deposition along the wall 28. The condensate 13 of the purer vapors will run by gravity down the interior wall 28 of chamber 20 and will subsequently be collected by an annular catch ring 40 and transported out of chamber 20 through second outlet 29 and into second chamber 50. Second chamber 50 is a distillation tower, which, similar to the cold-wall reactor chamber 20, has a bottom portion 51, a mid-portion 52 and a top portion 53, and a first outlet 55, a second outlet 56 and a third outlet 57. The bottom portion 51 is at least partially surrounded by heater 54, which will heat the bottom portion 51 of chamber 50 to a temperature ($T_3$) of about 310° C. Similar to the temperature gradient formed by heater 26 in chamber 20, a temperature gradient is formed in chamber 50 such that the temperature ($T_4$) at the first outlet 55 is lower than the temperature ($T_5$) at the second outlet, which is lower than the temperature ($T_6$) at the third outlet, which is lower than $T_3$.

Figure 2:
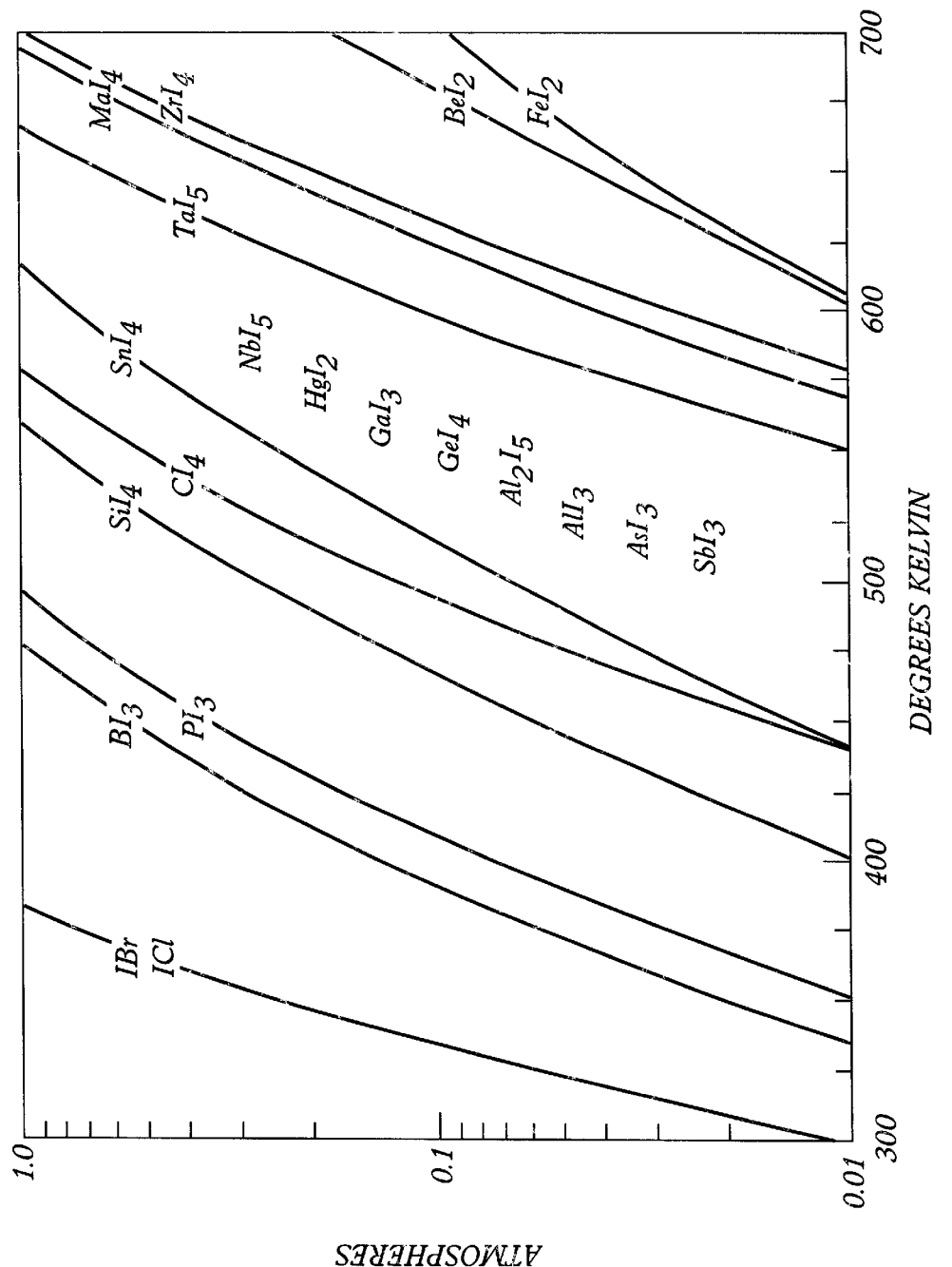
FIG. 2 is a graph showing relative Iodide vapor pressures.

Referring to FIG. 2, it is shown that most of the potential impurity iodides (i.e., $FeI_2$, $AlI_3$, etc.) have vapor pressures lower than the vapor pressure of silicon tetraioidide, thus those potential impurity iodides will remain in the liquid mix 15 in the bottom portion 51 of the chamber, while boron triiodide, phosphorus triiodide and carbon tetraiodide, that have higher partial pressures than silicon tetraiodide, will vaporize along with silicon tetraiodide at temperature $T_3$ and at about atmospheric pressure. As can be seen in FIG. 2, at one atmosphere, boron triiodide and phosphorus triiodide boil at about 63° C. lower than silicon tetraiodide, and carbon tetraiodide boils at about 19° C. higher than silicon tetraiodide.

Thus, the three outlets 55, 56, 57 of chamber 50 of the preferred embodiment are positioned such that first outlet 55 is positioned in the top portion 53 of chamber 50 at temperature $T_4$, the second outlet 56 is positioned below first outlet 55 at a temperature $T_5$, and third outlet 57 is positioned below second outlet 56 but above the bottom portion 51 of chamber 50 and is at temperature $T_6$. Upon the application of heat by heater 54 to the bottom portion 51 of chamber 50, the silicon tetraiodide and the other impurity iodides are vaporized and driven upwardly through the chamber 50. At the first outlet 55, temperature $T_4$ is about 120° C. and the vaporized impurity iodides that have lower boiling points than silicon tetraiodide vapor (i.e. $BI_3$ and $PI_3$) condense, as is indicated by droplets 17, and are collected by annular catch ring 43 and removed from chamber 50 at a cold trap similar to the way that the impurity iodides are trapped in, and removed from, the cold-wall reaction chamber 20, as disclosed above. Similarly, at the second outlet 56, temperature $T_5$ is about 180° C., the temperature at which silicon tetraiodide condenses as shown by droplets 16. Condensed silicon tetraiodide 16 is collected by annular catch ring 42 and removed from chamber 50 via second outlet 56, which is connected to chamber 80, which in the preferred embodiment, is a reservoir used to temporarily store liquid silicon tetraiodide 16. Lastly, third outlet 57 is maintained at temperature $T_6$ at about 205° C., the temperature at which carbon tetraiodide is condensed, as illustrated by droplets 18, collected by annular catch ring 44, and removed at a cold trap in the same manner as has been previously discussed.

At this stage of the operating cycle, the purified silicon tetraiodide 16 that has been collected in chamber 80, is returned to chamber 20 via outlet 81 through the opening of valve 82. When the purified liquid silicon tetraiodide 16 collects in the bottom portion 21 of chamber 20, the heat applied to bottom portion 21 is increased to a temperature ($T_f$) in excess of 1000° C., and preferably in the range of 1000° to 1400° C. At temperature $T_f$, the purified silicon tetraiodide ($SiI_4$) 16 further reacts with the still-present silicon from the MG-Si source material 11 to form silicon diiodide ($SiI_2$) vapor. The silicon diiodide vapor is very unstable and, as the vapor is driven upwardly into the mid-portion 22 of chamber 20, the chemical reaction, $Si_2 \rightarrow Si + Si_4$, drives the disproportionation of $SiI_2$ and the deposition of silicon (Si) onto substrate(s) 40. Other metal iodides (i.e., $AlI_3$, etc.) have very large and negative values of free energy of formation, and while they will form vapors readily, within the deposition zone, they exhibit a very small tendency to be reduced and thus the silicon deposition on the substrate(s) 40 is quite pure. Substrate(s) 40 are preferably high purity silicon slim rods or tubes or carbon tubes or rods, and are heated by heater 30 to a temperature ($T_s$) of about 750° C. The temperature $T_f$ is continuously applied to bottom portion 21 of chamber 20 for the remainder of the cycle. The silicon tetraiodide vapor and the other metal impurity iodide vapors generated by the secondary reaction at temperature $T_f$ go through the distillation process as described above for a second (or third, fourth, etc) time before again returning as purified silicon tetraiodide 16 from outlet 81 of reservoir 80 to the bottom portion 21 of chamber 20.

The replenishment of MG-Si and iodine source materials 11, 12 is accomplished through inlet 24 of chamber 20 along with a purging gas flow at the opening 25, and the volatile gases are kept in the system 10 by a blanketing cloud layer due to the condensation of iodine vapor plus the gravity effect as described in detail in U.S. patent application Ser. No 09/334,166, filed on Jun. 15, 1999 by the applicants and assigned to the same entity and incorporated herein by reference. The ability to replenish the source materials, recycle byproducts, and continuously load and unload substrate(s) 40 gives the above-described process and apparatus significant cost advantages over existing and previously disclosed silicon purification systems. Further, the fact that the system 10 is an open system that operates at about atmospheric pressure eliminates the need to incorporate expensive vacuum equipment into the manufacturing cycle, further reducing total system cost. Finally, the disclosed system 10 can be modified by increasing the number of chambers to potentially include separate chambers for doping silicon feedstock and can likewise by modified by changing the number of outlets and the relative temperatures to specifically target particular impurities with defined partial pressures, vaporization points and condensation points.

Figure 3:
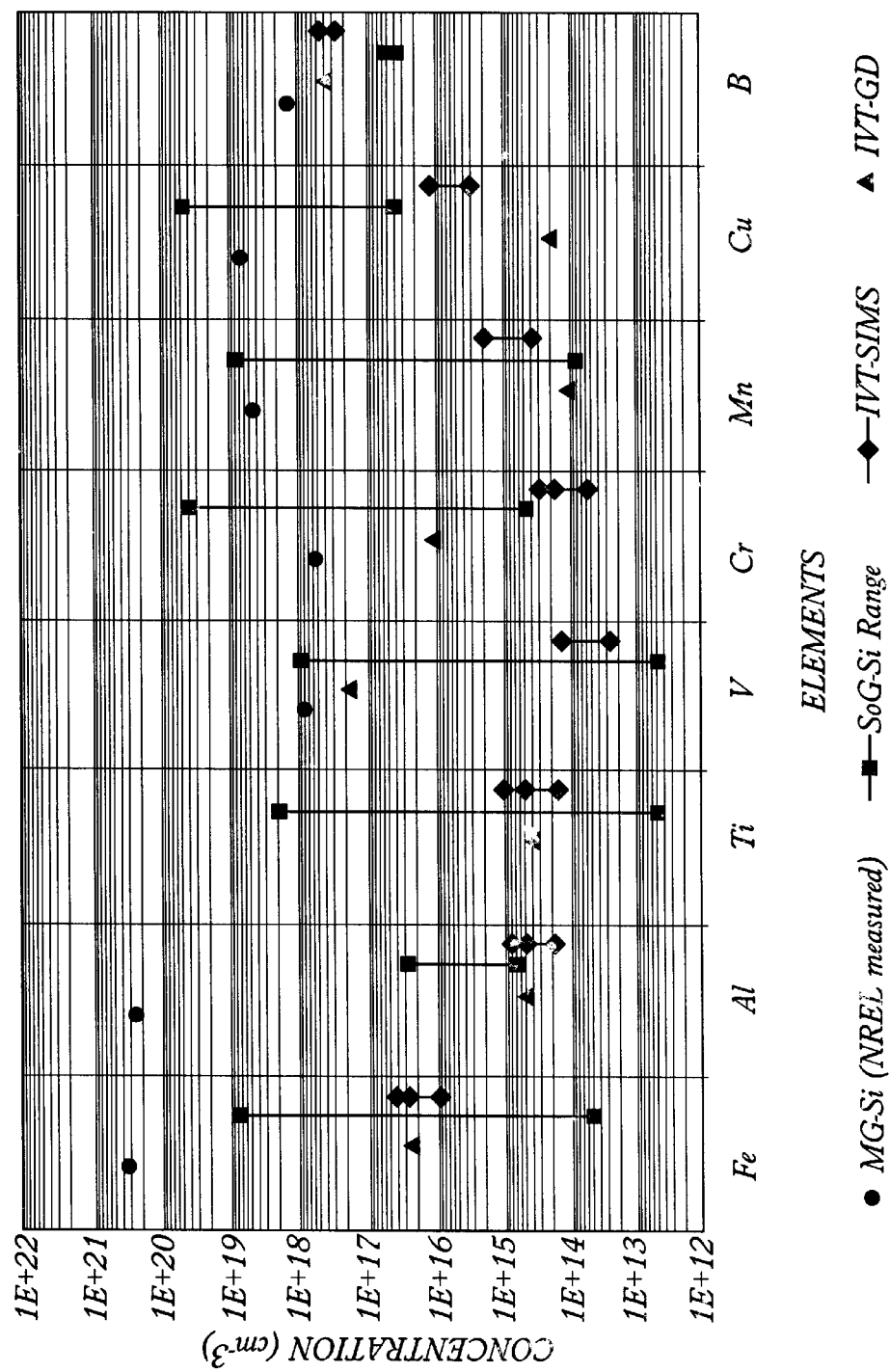
FIG. 3 is a graph showing impurity levels in the MG-Si source material and in an epitaxial silicon layer grown by the process and apparatus of the present invention.

The above-described purification technique and apparatus provided example results as follows. With a source silicon temperature $(T_f)$>1200° C. and a substrate temperature $(T_s)$ of about 1000° C., a purified silicon deposition rate>5 $\mu$m/min was achieved. The resultant single-crystal substrates were approximately 100 $\mu$m-thick epitaxial silicon layers. Impurity levels in the layers were analyzed by secondary ion mass spectrometry (SIMS) and glow discharge mass spectroscopy (GDMS) and the results are shown in FIG. 3. Specifically, the graph shows the measured initial impurity level of the metallurgical-grade silicon which is denoted by a circular dot. The allowable solar-grade silicon (SoG-Si) content range is denoted by two connected squares, with each square representing the minimum and maximum level of each impurity necessary to meet the minimum purity requirements for SoG-Si. The triangular marks denote the impurity level results generated by the ICVT technique described above as measured by GDMS, and the diamond-shaped marks denote the same results as measured by the SIMS. With the exception of boron (and phosphorus which is not shown), all results produced by the method and apparatus disclosed by the present invention, show reductions by several orders of magnitude and are within the target ranges. And with the addition of the distillation chamber 50 to the system 10, the levels of boron (and phosphorus) would be reduced to within the allowable SoG-Si range as well.

A second experiment was conducted using multiple large area substrates for ICVT growth of thick layers that were harvested and melted as feedstock for Czochralski (CZ) crystal growth and analysis. All major impurities were greatly reduced as shown by Table 1 below:

| Element | CZ-Si from ICVT (ppma) | MG-Si source (ppma) |
|---------|------------------------|---------------------|
| B | 4.157 | 14.548 |
| C | 14.264 | 107.565 |
| O | 17.554 | 66.706 |
| Mg | <0.001 | 8.204 |
| Al | <0.005 | 520.458 |
| Si | matrix | matrix |
| P | 6.801 | 21.762 |

-continued

| Element | CZ-Si from ICVT (ppma) | MG-Si source (ppma) |
|---------|------------------------|---------------------|
| S | <0.044 | 0.096 |
| K | <0.007 | <0.036 |
| Ca | <0.007 | 44.849 |
| Ti | <0.001 | 47.526 |
| V | <0.001 | 143.345 |
| Cr | <0.001 | 19.985 |
| Mn | <0.001 | 19.938 |
| Fe | <0.005 | 553.211 |
| Co | <0.002 | 0.763 |
| Ni | <0.002 | 22.012 |
| Cu | <0.001 | 1.724 |
| Zn | <0.002 | 0.077 |
| As | <0.002 | 0.007 |
| Sr | <0.0003 | 0.353 |
| Zr | <0.0003 | 2.063 |
| Mo | <0.001 | 0.790 |
| I | <0.0002 | <0.001 |
| Ba | <0.0002 | 0.266 |
| W | <0.0003 | 0.024 |

Figure 4:
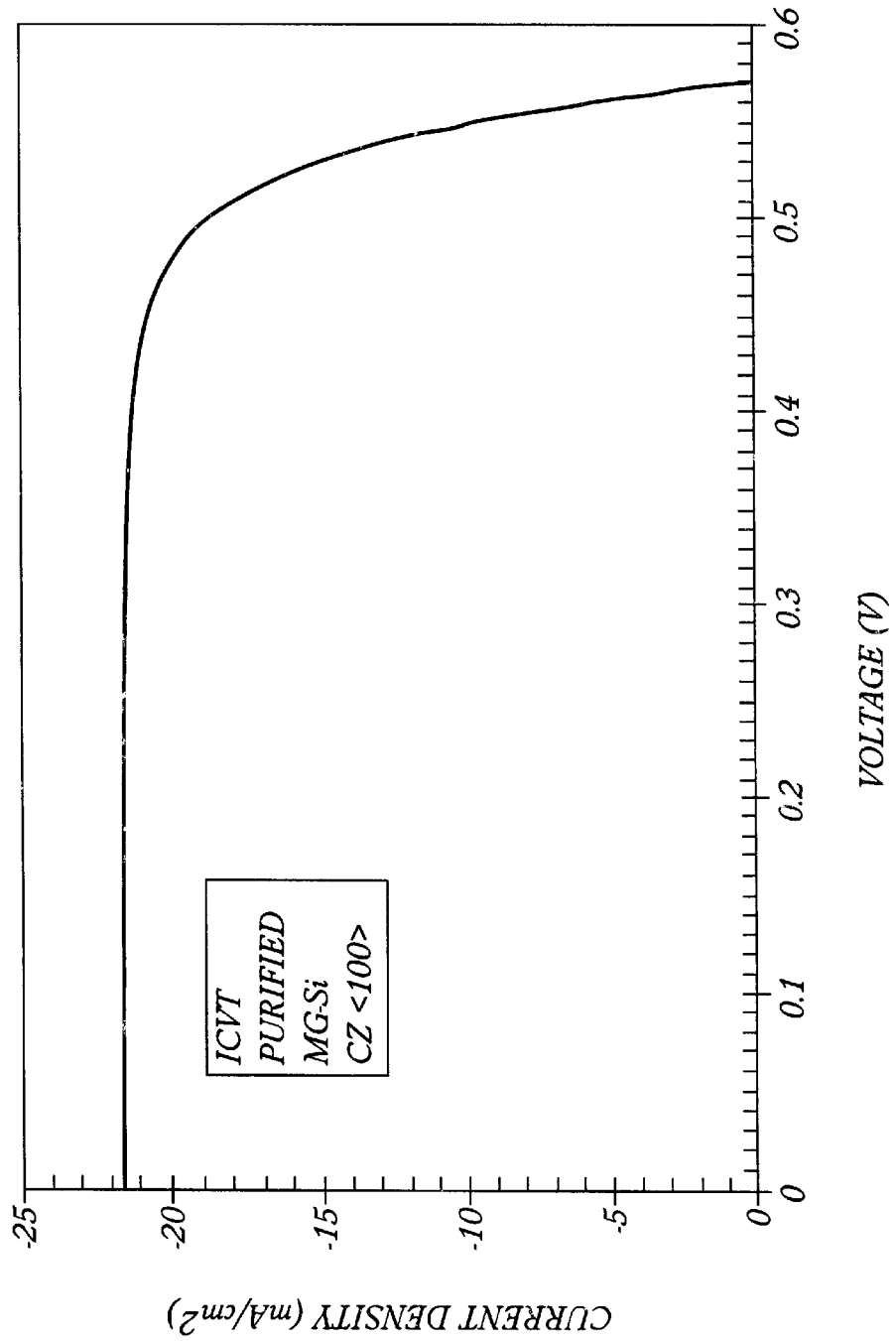
FIG. 4 is a graph showing diagnostic solar cell parameters for a wafer from a crystal grown using ICVT-purified MG-Si produced by the process and apparatus of the present invention.

All the metal impurities, as illustrated above, were below the detection limits of the GDMS technique. The resultant crystal created diagnostic solar cells with efficiencies of 9.5% and voltage v. current density characteristics as illustrated by the graph in FIG. 4. Thus, the ICVT technique disclosed and illustrated herein, along with the apparatus described above and claimed below, generated purified silicon feedstock consistently and predictably, at fast deposition rates and at low operating costs.

The foregoing is considered as illustrative only of the principal of the invention. Further, since numerous modifications and changes will occur to those persons skilled in the art, it is not desired to limit the invention to the exact construction and operation shown and described, and accordingly all suitable modifications and equivalents may be resorted to falling within the scope of the invention as defined by the claims which follow.

What is claimed is:

1. A process for purifying metallurgical-grade silicon and depositing the purified silicon, comprising:

placing iodine source material and metallurgical-grade silicon source material into a first chamber, the first chamber having a bottom portion, a mid-portion and a top portion, a first inlet wherethrough the iodine source material and the metallurgical-grade silicon source material enter, a first outlet positioned in the top portion, a second outlet positioned below the first outlet and a second inlet positioned below the second outlet, the first chamber in fluid communication with, and sealably connected through the second outlet to a second chamber, the second chamber having a bottom portion, a mid-portion and a top portion, a first outlet positioned in the top portion, a second outlet positioned below the first outlet and a third outlet positioned below the second outlet, the second outlet of the second chamber in fluid communication with, and sealably connected through the second outlet of the second chamber to a third chamber, the third chamber in fluid communication with, and sealably connected through an outlet to the second inlet of the first chamber, and maintaining the first, second and third chambers at about atmospheric pressure;

heating the iodine source material and the metallurgical-grade silicon source material in the bottom portion of the first chamber to a temperature sufficiently high to vaporize the iodine source material and to react some, but not all, of the iodine source material with the metallurgical-grade silicon source at about atmospheric pressure to create a deposition precursor of silicon tetraiodide vapor, iodine vapor and at least one metal impurity iodide vapor while maintaining about atmospheric pressure in the first chamber;

driving the iodine vapor, the silicon tetraiodide vapor and any metal impurity iodide vapor upwardly from the bottom portion of the first chamber, through the mid-portion of the first chamber and into the top portion of the first chamber to condense the iodine vapor, the silicon tetraiodide vapor and any metal impurity iodide vapor in the top portion of first chamber, including forming an iodine vapor cloud in the top portion of the chamber, by forming and maintaining a temperature gradient in the first chamber, such that the mid-portion has a temperature that is lower than the temperature of the bottom portion, but higher than the boiling temperature of iodine and higher than the boiling temperature of silicon tetraiodide at atmospheric pressure, and such that the top portion has a temperature that is lower than the temperature of the mid-portion, and lower than the boiling point of silicon tetraiodide and lower than the melting point of the metal impurity iodide, but higher than the melting point of iodine, and such that a portion of the metal impurity iodide vapor can be condensed, collected and removed from the first chamber at the first outlet, and such that the silicon tetraiodide vapor and any remaining portion of the metal impurity iodide vapor can be condensed, collected and transferred from the first chamber to the bottom portion of the second chamber through the second outlet of the first chamber;

heating the silicon tetraiodide condensate and the metal impurity iodide condensate transferred from the first chamber to the bottom portion of the second chamber to a temperature sufficiently high to vaporize the silicon tetraiodide and the metal impurity iodide at about atmospheric pressure;

driving the silicon tetraiodide vapor and the metal impurity iodide vapor upwardly from the bottom portion of the second chamber, through the mid-portion of the second chamber and into the top portion of the second chamber to condense any metal impurity iodide vapor that exhibits a vapor pressure lower than that of silicon tetraiodide at about atmospheric pressure, and to condense, collect and remove any such condensate from the second chamber through the first outlet in the second chamber by forming a temperature gradient in the second chamber such that the temperature of the mid-portion of the second chamber has a temperature that is lower than the temperature of the bottom portion of the second chamber, but higher than the temperature of the top portion of the second chamber, and further to condense any silicon tetraiodide vapor in a position lower than the first outlet of the second chamber such that the silicon tetraiodide condensate can be collected and removed from the second chamber and transferred to the third chamber through the second outlet of the second chamber, and to condense any metal impurity iodide vapor that exhibits a vapor pressure higher than that of silicon tetraiodide at about atmospheric pressure, and to condense, collect and remove any such condensate from the second chamber through the third outlet in the second chamber;

collecting silicon tetraiodide condensate in the third chamber and transferring the silicon tetraiodide condensate from the third chamber to the bottom portion of the first chamber out through the outlet of the third chamber and in through the second inlet of the first chamber;

increasing the temperature of the bottom portion of the first chamber sufficiently high to vaporize the silicon tetraiodide condensate, the source iodine material and the source metallurgical-grade silicon material to vaporize the silicon tetraiodide, and to react some, but not all, of the source iodide material and the source metallurgical-grade material at about atmospheric pressure to create a deposition precursor of silicon diiodide vapor along with iodide vapor while maintaining about atmospheric pressure;

driving the silicon diiodide vapor upwardly from the bottom portion of the first chamber into the mid-portion of the first chamber by maintaining the temperature gradient in the first chamber; and placing a substrate in the mid-portion of the first chamber and heating the substrate to a temperature sufficient for the silicon diiodide vapor to decompose into pure silicon and silicon tetraiodide vapor, and to deposit a layer of pure silicon onto the substrate and to condense the silicon tetraiodide vapor such that the silicon tetraiodide condensate is collected and transferred from the first chamber to the bottom portion of the second chamber.

2. The process of claim 1, including flowing a blanketing gas, which is less dense than, and non-reactive with, iodine vapor, over the iodine vapor in the top portion of the first chamber.

3. The process of claim 1, whereby the temperature of the bottom portion of the first chamber is initially not greater than 1000° C.

4. The process of claim 3, whereby the temperature of the bottom portion of the first chamber is increased to a temperature in the range of about 1000° to about 1400° C. after the silicon tetraiodide condesate is transferred from the third chamber to the bottom portion of the first chamber.

5. The process of claim 1, whereby the substrate comprises either silicon or carbon.

6. The process of claim 5, whereby the temperature of the substrate is not less than 750° C.

7. The process of claim 6, whereby the temperature of the substrate is between 750° and 1000° C.

8. The process of claim 1, whereby the temperature at the top of the first chamber is about 120° C.

9. The process of claim 8, whereby the temperature at and above the second outlet of the first chamber and below the first outlet of the first chamber is in the range of greater than 120° C. and less than 700° C.

10. The process of claim 1, whereby the temperature at the bottom of the second chamber is about 310° C.

11. The process of claim 1, whereby the temperature at the first outlet of the second chamber is about 120° C.

12. The process of claim 1, whereby the temperature at the second outlet of the second chamber is about 180° C.

13. The process of claim 1, whereby the temperature at the third outlet of the second chamber is about 205° C.

* * * * *